(12) United States Patent
Hu et al.

(10) Patent No.: US 7,598,775 B2
(45) Date of Patent: Oct. 6, 2009

(54) PHASE AND FREQUENCY DETECTOR WITH ZERO STATIC PHASE ERROR

(75) Inventors: Pengfei Hu, Shanghai (CN); Juan Qiao, Shanghai (CN); Zhongyuan Chang, Shanghai (CN)

(73) Assignee: Integrated Device Technology, inc., San Jose, CA (US)

( * ) Notice: Subject to any disclaimer, the term of this patent is extended or adjusted under 35 U.S.C. 154(b) by 0 days.

(21) Appl. No.: 12/004,271

(22) Filed: Dec. 19, 2007

(65) Prior Publication Data

US 2009/0160487 A1 Jun. 25, 2009

(51) Int. Cl.
*H03D 13/00* (2006.01)
(52) U.S. Cl. .................................. 327/12; 327/7; 327/3
(58) Field of Classification Search ............... 327/2, 327/3, 5, 7, 8, 12
See application file for complete search history.

(56) References Cited

U.S. PATENT DOCUMENTS

| | | | | |
|---|---|---|---|---|
| 4,904,948 A | * | 2/1990 | Asami | 327/12 |
| 5,373,255 A | * | 12/1994 | Bray et al. | 331/1 A |
| 6,002,273 A | * | 12/1999 | Humphreys | 327/3 |
| 6,605,935 B2 | * | 8/2003 | Nilsson | 324/76.53 |
| 6,642,747 B1 | * | 11/2003 | Chiu | 327/40 |
| 7,046,042 B1 | * | 5/2006 | Dino et al. | 327/3 |

* cited by examiner

*Primary Examiner*—Lincoln Donovan
*Assistant Examiner*—Hai L Nguyen
(74) *Attorney, Agent, or Firm*—Finnegan, et al.

(57) ABSTRACT

A method and circuit for phase and frequency detection having zero static phase error for use in a phase-locked loop system is presented. The phase and frequency detector utilizes a first phase and frequency detector configured to generate first and second pulsed PFD signals. Pulse blocking circuitry is utilized to provide first and second output signals based on the first and second pulsed signals respectively, wherein a time period when both first and second output signals are asserted is substantially reduced from a time period when both first and second pulsed signals are asserted. By reducing the time the first and second output signals are simultaneously asserted, the effects of charge pump current source mismatch are minimized and static phase error is reduced.

7 Claims, 5 Drawing Sheets

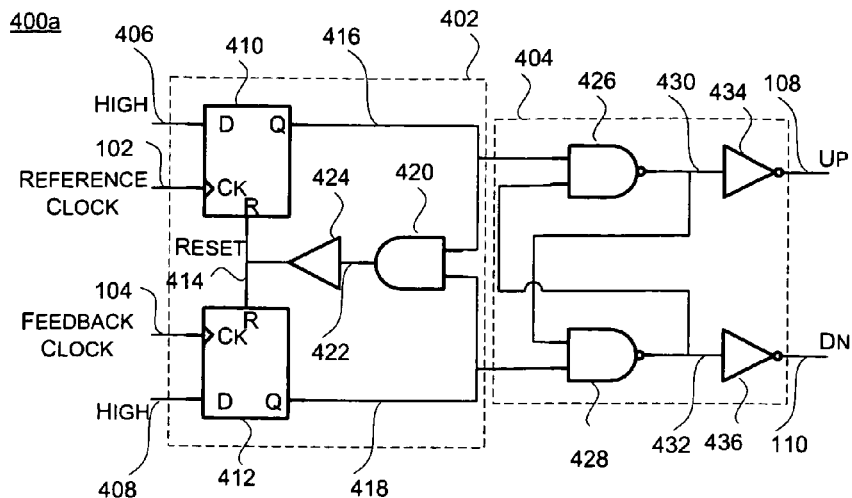
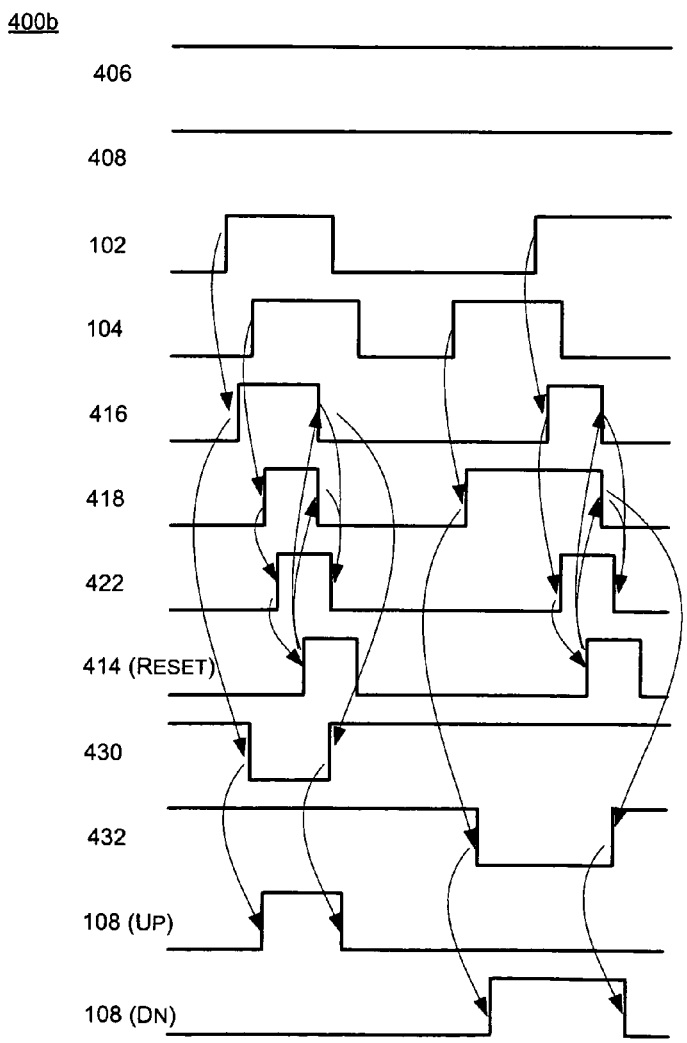
FIGURE 4a
FIGURE 4b

PHASE AND FREQUENCY DETECTOR WITH ZERO STATIC PHASE ERROR

BACKGROUND

1. Field of the Invention

The present invention relates to phase-locked loops and, more specifically, to phase and frequency detection with little static phase error in phase-locked loop systems.

2. Discussion of Related Art

Phase-locked loops ("PLLs") are widely used in modern electronic devices due to their capability of generating an internal feedback clock signal that is phase aligned with an external reference clock signal. PLLs have been utilized in various applications including, for example, cross-chip communications, signal synchronization, data recovery, and frequency modulation.

A typical PLL integrates a phase and frequency detector ("PFD"), a charge pump, a low pass filter, and a voltage-controlled oscillator ("VCO") in a negative feedback closed-loop configuration. The PFD in a PLL receives a reference clock signal and an internal feedback clock signal and generates two pulsed signals based on the detected phase difference between the reference clock and internal feedback clock signal. These pulsed signals drive the charge pump to adjust the control voltage provided to the VCO, thereby changing the frequency of the signal, output by the VCO. In current PFD implementations, the level of both pulsed signals generated by the PFD may be set to a high logic level during a period when no charge should be injected by the charge pump. In such an instance, if the source and sink current sources are perfectly matched, the net charge injected by the charge pump is ideally zero. Actual charge pump current sources, however, often exhibit some mismatch, causing the internal feedback clock signal generated by the VCO to shift in phase from its ideal location. Non-ideal phase shift attributed to mismatched charge pump current sources is called static phase error. Static phase error may be reduced by minimizing the period during which the charge pump source and sink current sources simultaneously inject charge.

It is desirable to develop a novel and improved PFD that reduces static phase error and relaxes matching requirements of charge pump currents.

SUMMARY

In accordance with some embodiments of the present invention, a phase and frequency detector includes a first phase and frequency detector configured to generate first and second pulsed signals in response to a comparison between a defined occurrence of first and second input signals; and a pulse blocker that receives the first and second pulsed signals and provides first and second output signals, wherein a time period when both first and second output signals are asserted is substantially reduced from a time period when both first and second pulsed signals are asserted.

In some embodiments the first phase and frequency detector may comprise first and second D-type flip-flops, wherein the clocking terminals of the first and second D-type flip-flops receive the first and second input signals respectively, the D terminals of the first and second D-type flip-flops are set to an asserted state, and the Q outputs of the first and second D-type flip-flops provide the first and second pulsed signals respectively; and a reset signal generator for asserting a reset signal provided to the reset terminals of the first and second D-type flip-flops based on the state of the first and second pulsed signals. Further, in some embodiments, the pulse blocker may comprise first and second NAND gates, wherein the first NAND gate is enabled by the first pulsed signal and the output of the second NAND gate, and the second NAND gate is enabled by the second pulsed signal and the output of the first NAND gate; a first inverter configured to invert the output of the first NAND gate and provide the first output signal; and a second inverter configured to invert the output of the second NAND gate and provide the second output signal.

In accordance with some embodiments of the present invention, a method for detecting the phase difference between a first and a second input signal includes generating first and second pulsed signals based on the first and second input signals, the first pulsed signal being switched to a second state from a first state in response to a defined occurrence of the first input signal, the second pulsed signal being switched to the second state from the first state in response to the same defined occurrence of the second input signal, and the first and second pulsed signals being switched from the second state to the first state after a certain delay period following both of the first and second pulsed signals reaching the second state; and generating first and second output signals based on the first and second pulsed signals respectively, such that in response to the first pulsed signal reaching the second state prior to the second pulse signal reaching the second state, the first output signal is switched to the second state from the first state for the period after the first pulsed signal reaches the second state and before the second pulsed signal reaches the second state, and in response to the second pulsed signal reaching the second state prior to the first pulsed signal reaching the second state, the second output signal is switched to the second state from the first state for the period after the second pulsed signal reaches the second state and before the first pulsed signal reaches the second state.

Further embodiments and aspects of the invention are discussed with respect to the following figures, which are incorporated in and constitute a part of this specification.

BRIEF DESCRIPTION OF THE DRAWINGS

FIG. 4a illustrates a schematic diagram of a PFD that includes pulse blocking circuitry in accordance with some embodiments of the present invention.

FIG. 4b illustrates an exemplary signal timing diagram of the PFD that includes pulse blocking circuitry illustrated in FIG. 4a in accordance with some embodiments of the present invention.

In the figures, elements having the same designation have the same or similar functions.

DETAILED DESCRIPTION

Figure 1:
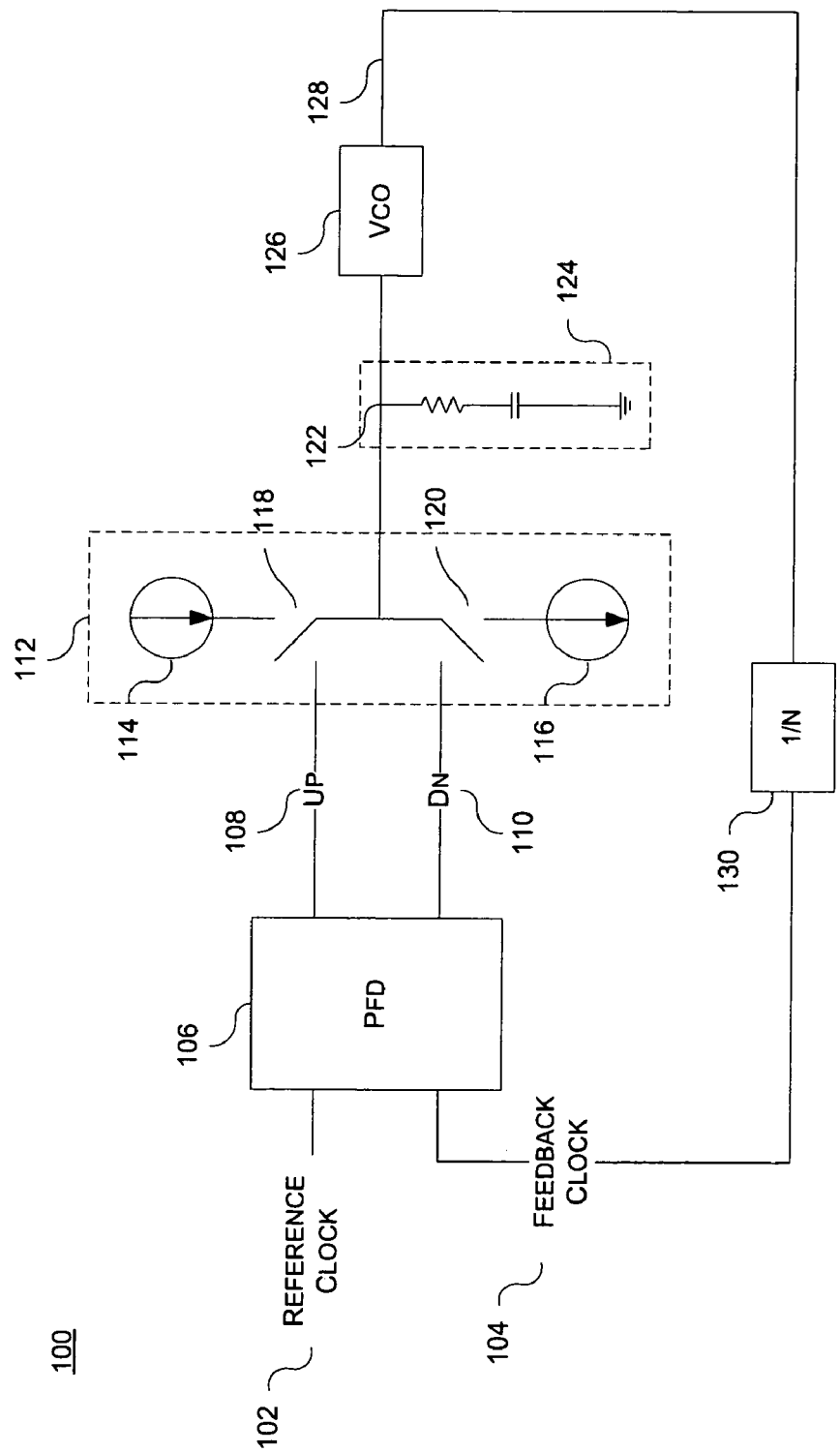
FIG. 1 illustrates a schematic diagram of a charge pump PLL in accordance with some embodiments of the present invention.

FIG. 1 illustrates a schematic diagram of a charge pump PLL 100 in accordance with some embodiments of the present invention. Charge pump PLL 100 includes PFD 106, charge pump 112, low pass filter 124, and VCO 126 in a negative feedback closed-loop configuration. In some embodiments, charge pump PLL 100 may include frequency divider 130 in the feedback loop path between VCO 126 and PFD 106.

PFD 106 receives reference clock signal 102 and internal feedback clock signal 104, generating pulsed signals UP 108 and DN 110. In some embodiments, the relative pulse width of signals UP 108 and DN 110 is proportional to the phase difference between reference clock 102 and internal feedback clock 104 as detected by PFD 106. Charge pump 112 receives signals UP 108 and DN 110 from PFD 106 and injects charge using source current source 114 and/or sink current source 116 based on the levels of signals UP 108 and DN 110. For example, when UP 108 is set to a high logic level, charge pump 112 switch 118 may cause source current source 114 to inject charge at PLL node 122. Similarly, when DN 110 set to a high logic level, charge pump 112 switch 120 may cause sink current source 116 to inject negative charge at node 122.

Charge injected by charge pump 112 into PLL node 122 is filtered by low pass filter 124 and fed to the control input of VCO 126. VCO 126 generates VCO output signal 128 having a given frequency based on the voltage provided to the control input of VCO 126. Frequency divider 130 divides the frequency of VCO output signal 128 by an integer N to generate internal feedback clock signal 104. Internal feedback clock signal 104 is coupled to PFD 106 as an input signal, thereby forming a negative feedback loop. In some embodiments, VCO output signal 128 may be fed directly to PFD 106 as a reference input.

During PLL operation, if internal feedback clock signal 104 is not phase aligned with reference clock signal 102, PFD 106 drives charge pump 112 via signals UP 108 and DN 110 to adjust the voltage provided to the control input 122 of VCO 126. Charge pump 112 adjusts the voltage provided to the control input of VCO 126 accordingly until internal feedback clock signal 104 is phase aligned with reference clock signal 102 (i.e., phase locked). Once internal feedback clock signal 104 is phase aligned with reference clock signal 102, VCO output 128 and/or internal feedback clock signal 104 may be used to synchronize system events with reference clock signal 102.

Figure 2A:
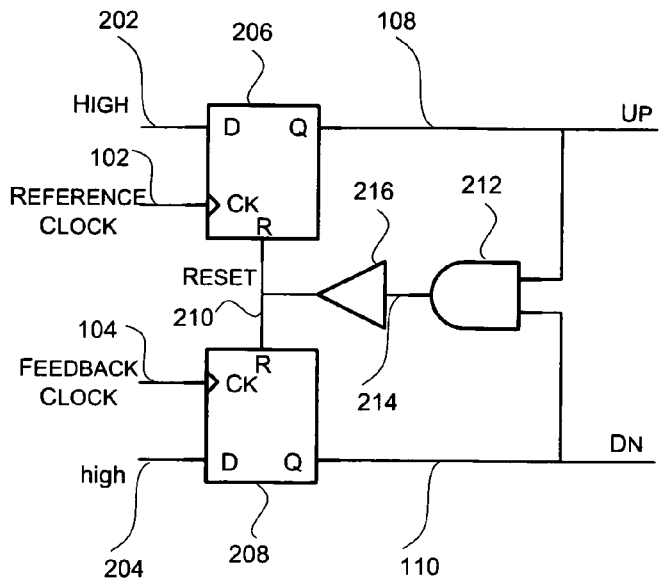
FIG. 2a illustrates a schematic diagram of a PFD in accordance with some embodiments of the present invention.

FIG. 2a illustrates a schematic diagram of a PFD 200a in accordance with some embodiments of the present invention. PFD 200a includes two D flip-flops ("DFFs") 206, 208, AND gate 212, and delay buffer 216. The D input of DFF 206 is coupled to signal 202 set to a constant high logic level. Similarly, the D input of DFF 208 is coupled to signal 204 set to a constant high logic level. In some embodiments, a single signal set to a constant high logic level may be coupled to the D inputs of both DFFs 206, 208. The clock input of DFF 206 is coupled to PLL reference clock signal 102. Similarly, the clock input of DFF 208 is coupled to internal feedback clock signal 104 provided by VCO 126 of PLL system 100 via the feedback loop.

PFD 200a output UP 108 is provided by the Q output of DFF 206. Similarly PFD 200a output DN 110 is provided by the Q output of DFF 208. PFD 200a output signals UP 108 and DN 110 are coupled to AND gate 212 as inputs. Delay buffer 216 receives the output 214 of AND gate 212 and provides the reset signal 210 for DFFs 206 and 208.

Figure 2B:
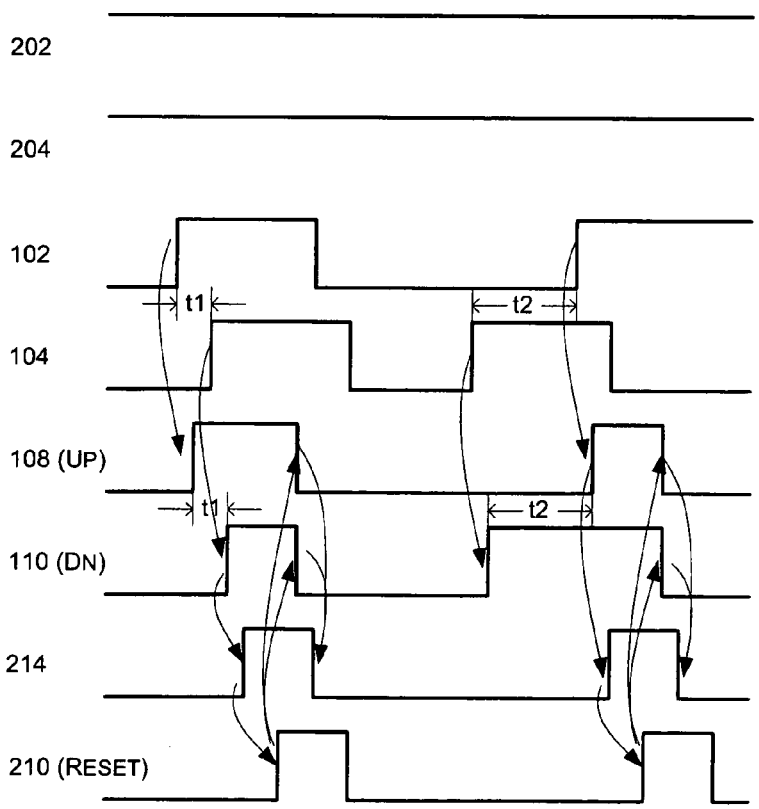
FIG. 2b illustrates an exemplary signal timing diagram of the PFD illustrated in FIG. 2a in accordance with some embodiments of the present invention.

FIG. 2b illustrates an exemplary signal timing diagram 200b of PFD 200a in accordance with some embodiments of the present invention. The operation of PFD 200a is described below with reference to signal timing diagram 200b. For illustrative purposes a situation where reference clock signal 102 leads internal feedback clock signal 104 is described. PFD 200a, however, operates similarly when internal feedback clock signal 104 leads reference clock signal 102. As described, DFFs 206 and 208 are configured to capture D inputs 202 and 204 at the rising edges of reference clock 102 and internal feedback clock 104 respectively. However, in some embodiments, DFFs 206 and 208 may be configured to capture according to the falling edges of their respective clock signals.

The Q output of DFF 206, corresponding with PFD 200a output signal UP 108, captures the state of D input signal 202 at every rising edge of reference clock signal 102. As DFF 206 D input signal 202 is set to a constant high logic level, at every rising edge of reference clock signal 102, PFD output UP 108 is set to a high logic level after a period corresponding to the inherent capture delay time of DFF 206. Similarly, the Q output of DFF 208, corresponding with PFD 200a output signal DN 110, captures the state of D input signal 204 at every rising edge of internal feedback clock signal 104. As DFF 208 D input signal 204 is set to a constant high logic level, at every rising edge of internal feedback clock signal 104, PFD output DN 110 is set to a high logic level after a period corresponding to the inherent capture delay time of DFF 208. The phase mismatch between reference clock signal 102 and internal feedback clock signal 104, t1 and t2, is shown with respect to their rising signal edges. Assuming that DFF 206 and DFF 208 exhibit the same inherent capture delay time, the phase mismatch between UP 108 and DN 110, measured with respect to their rising edges will also be t1 and t2.

When signals UP 108 and DN 110 are set to high logic levels by DFF 206 and DFF 208 respectively, AND gate 212 output signal 214 is set to a high logic level after a period corresponding to the inherent delay time of AND gate 212. AND gate output signal 214 is delayed by delay buffer 216 and the delayed AND gate output signal 214 is provided to DFF 206 and DFF 208 as reset signal 210. Once reset signal 210 is asserted and after the inherent reset delay time of the DFFs 206 and 208, DFF 206 Q output UP 108 and DFF 208 Q output DN 110 reset to a low logic level. Output UP 108 and DN 110 and remain at this level until DFF 206 and DFF 208 capture the signal levels at inputs 202 and 204 at the next rising clock edges of reference clock signal 102 and internal feedback clock signal 104 respectively.

The differential width t1 between PFD 200a output UP 108 and DN 110 is proportional to the phase difference between reference clock signal 102 and internal feedback clock signal 104. However, in this PFD implementation, output signals UP 108 and DN 110 are asserted simultaneously for a period corresponding to the cumulative delay time of AND gate 212, delay buffer 216, and the reset time of DFFs 206 and 208. Due to current source mismatch in charge pump 112, as described below with reference to FIG. 3, when signals UP 108 and DN 110 are both asserted, charge pump 112 may inject charge when ideally no net charge should be injected.

Figure 3:
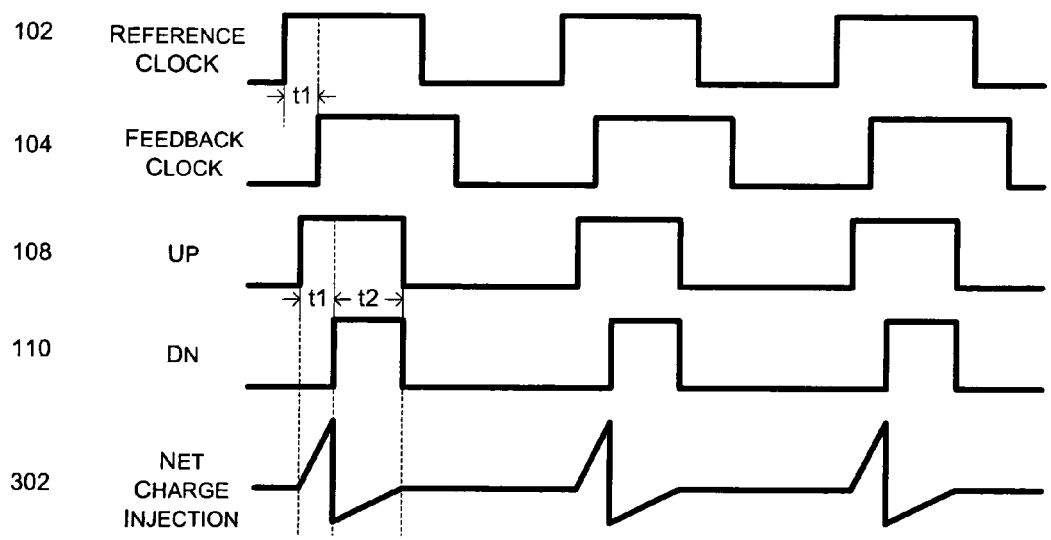
FIG. 3 illustrates an exemplary signal timing diagram of a PLL that utilizes the PFD shown in FIG. 2a in locked status wherein the PLL charge pump current sources are mismatched, in accordance with some embodiments of the present invention.

FIG. 3 illustrates an exemplary signal timing diagram 300 of a PLL 100 that utilizes PFD 200a in locked status wherein charge pump current sources 114 and 116 are mismatched, in accordance with some embodiments of the present invention. For illustrative purposes, a situation wherein charge pump 112 sink current source 116 is larger than source current source 114 is considered. PLL 100 utilizing PFD 200a, however, operates similarly when charge pump source current source 114 is larger than sink current source 116.

PFD output signals UP 108 and DN 110 are asserted simultaneously for time period t2, corresponding to the cumulative delay time of AND gate 212, delay buffer 216, and the reset time of DFFs 206 and 208. During this period, both sink current source 116 and source current source 114 inject current into PLL node 122. As sink current source 116 is larger than source current source 114, a negative net charge is injected into PLL node 122 when both current sources 114 and 116 are injecting charge. This net negative charge causes internal feedback clock signal 104 to lag reference clock signal 102 by fixed period t1. During period t1, source current source 114 injects charge into PLL node 122 to cancel the negative net charge injected into PLL node 122 during period t2. In this manner, a static phase error occurs between reference clock 102 and internal feedback clock 104 despite PLL 100 being in a phase locked status.

FIG. 4a illustrates a schematic diagram of a PFD that includes pulse blocking circuitry 400a in accordance with some embodiments of the present invention. PFD with pulse blocking circuitry 400a includes PFD 402 and pulse blocking circuitry 404. PFD 402 includes two D flip-flops ("DFF") 410 and 412, AND gate 420, and delay buffer 424. Pulse blocking circuitry 404 includes two NAND gates 426 and 428 and two inverters 434 and 436.

The D input of DFF 410 is coupled to input signal 406 which is set to a constant high logic level. Similarly, the D input of DFF 412 is coupled to input signal 408 which is set to a constant high logic level. In some embodiments, a single signal set to a constant high logic level may be coupled to the D inputs of both DFFs 410 and 412. The clock input of DFF 410 is coupled to PLL reference clock signal 102. Similarly, the clock input of DFF 412 is coupled to internal feedback clock signal 104 provided by VCO 126 of PLL system 100 via the feedback loop. DFF 410 Q output 416 and DFF 412 Q output 418 are provided as inputs to AND gate 420. AND gate output 422 is delayed by delay buffer 424 and the delayed output is provided to DFFs 410 and 412 as reset signal 414.

Q output 416 of DFF 410 is fed to one of the inputs of NAND gate 426. The other input of NAND gate 426 is fed by the output 432 of NAND gate 428. Similarly, Q output 418 of DFF 412 is fed to one of the inputs of NAND gate 428. The other input of NAND gate 428 is fed by the output 430 of NAND gate 426. NAND gate 426 output 430 is fed to inverter 434 which generates PFD 400a output signal UP 108. NAND gate 428 output 432 is fed to inverter 436 which generates PFD 400a output signal DN 110.

FIG. 4b illustrates an exemplary signal timing diagram 400b corresponding with PFD including pulse blocking circuit 400a in accordance with some embodiments of the present invention. The operation of PFD including pulse blocking circuitry 400a is described below with reference to signal timing diagram 400b. For illustrative purposes, a situation wherein reference clock signal 102 leads internal feedback clock signal 104 is described. PFD 400a, however, operates similarly when internal feedback clock signal 104 leads reference clock signal 102.

The Q output 416 of DFF 410 captures the state of D input signal 406 at every rising edge of reference clock signal 102. As DFF 410 D input signal 406 is set to a constant high logic level, at every rising edge of reference clock signal 102 DFF 410 Q output 416 is set to a high logic level after a period corresponding to the inherent capture delay time of DFF 410. Similarly, the Q output 418 of DFF 412 captures the state of D input signal 408 at every rising edge of internal feedback clock signal 104. As DFF 412 D input signal 408 is set to a constant high logic level, at every rising edge of internal feedback clock signal 104 DFF 412 Q output 418 is set to a high logic level after a period corresponding to the inherent capture delay time of DFF 412. When Q output 416 of DFF 410 is set to a high logic level, output 430 of NAND gate 426 drops to a low logic level after a period corresponding to the delay time of NAND gate 426. This in turn causes PFD 400a output UP 108 to be set to a high logic level. Further, this keeps output 432 of NAND gate 428 set to a high logic level thereby preventing output DN 110 from being asserted.

Once Q output 416 of DFF 410 and Q output 418 of DFF 412 are both set to a high logic level, resetting of DFF 410 and DFF 418 initiates. AND gate 420 output 422 is set to a high logic level after a period corresponding to the inherent delay time of AND gate 420. AND gate 420 output 422 is delayed by delay buffer 424 and the delayed AND gate output is provided to DFF 410 and DFF 412 as reset signal 414. Once reset signal 414 is asserted and after the inherent reset delay time of the DFFs 408 and 410, DFF 410 Q output 416 and DFF 412 Q output 418 reset to a low logic level. DFF 410 Q output 416 and DFF 412 Q output 418 remain at this level until DFF 410 and DFF 416 Q outputs 416 and 418 capture inputs 406 and 408 at the next rising clock edges of reference clock signal 102 and internal feedback clock signal 104 respectively. After Q outputs 416 and 418 reset to a low logic level, NAND gate 426 output 430 is reset to a high logic level, thereby causing PLL output UP 108 to also reset to a low logic level.

When reference clock signal 102 leads feedback clock signal 104, only PFD output signal UP 108 is asserted. Similarly, when reference clock signal 102 lags feedback clock signal 104, only PFD 400a output signal DN 110 is asserted. By preventing PFD output signals UP 108 and DN 110 from simultaneously being set to a high logic level, the PFD utilizing pulse blocking circuitry 400a shown in FIG. 4a eliminates the effects of charge pump 112 current source mismatch and significantly reduces static phase errors.

Figure 5:
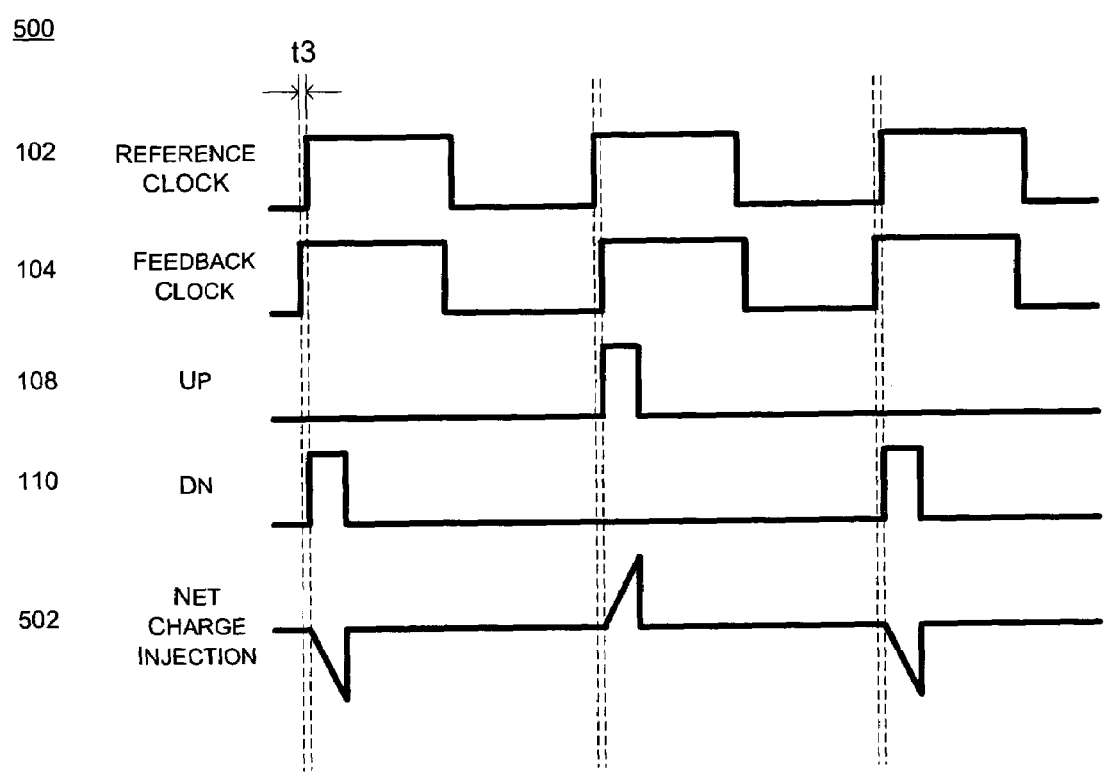
FIG. 5 illustrates an exemplary signal timing diagram a of PLL that utilizes the PFD shown in FIG. 4a in locked status, in accordance with some embodiments of the present invention.

FIG. 5 illustrates an exemplary signal timing diagram 500 of PLL 100 in locked status utilizing a PFD that includes pulse blocking circuitry 400a, in accordance with some embodiments of the present invention. As shown in FIG. 5, PFD output signals UP 108 and DN 110 are not asserted simultaneously by PFD with pulse blocking circuitry 400a. Accordingly, only one of current sources 114 and 116 of PLL charge pump 112 injects charge at a given time, thereby significantly reducing any static phase error caused by mismatch of charge pump 112 current sources 114 and 116. The net charge injected 502 by PLL charge pump 112 has equal magnitude but opposite polarities in every successive two periods, resulting in zero average net injected charge. Reference clock signal 102 and PLL internal feedback clock signal 104 lead each other alternatively by a period corresponding to remaining non-ideal phase shift t3. Non-ideal phase shift t3, attributed to static phase error between reference clock signal 102 and PLL internal feedback clock signal 104, is greatly minimized. In some embodiments, non-ideal phase shift t3 may be as small as sub-picoseconds.

Other embodiments of the invention will be apparent to those skilled in the art from consideration of the specification and practice of the invention disclosed herein. It is intended that the specification and examples be considered as exemplary only, therefore, the invention is limited only by the following claims.

What is claimed is:

1. A phase and frequency detector comprising:
   a first phase and frequency detector configured to generate first and second pulsed signals in response to a comparison between a defined occurrence of first and second input signals, the first phase and frequency detector including first and second D-type flip-flops, wherein the clocking terminals of the first and second D-type flip-flops are configured to receive the first and second input signals respectively, the D terminals of the first and second D-type flip-flops are set to an asserted state, and the Q outputs of the first and second D-type flip-flops provide the first and second pulsed signals respectively;

a reset signal generator configured to provide a reset signal to the reset terminals of the first and second D-type flip-flops based on the state of the first and second pulsed signals, wherein the reset signal generator includes an AND gate enabled by the first and second pulse signals and a delay buffer configured to delay the output the AND gate by a set delay to provide the reset signal; and a pulse blocker that receives the first and second pulsed signals and provides first and second output signals, wherein a time period when both first and second output signals are asserted is substantially reduced from a time period when both first and second pulsed signals are asserted.

2. The phase and frequency detector of claim 1, wherein the defined occurrence is the occurrence of a rising signal edge.

3. The phase and frequency detector of claim 1, wherein the defined occurrence is the occurrence of a falling signal edge.

4. The phase and frequency detector circuit of claim 1, wherein the pulse blocker comprises:

first and second NAND gates, wherein the first NAND gate is enabled by the first pulsed signal and the output of the second NAND gate, and the second NAND gate is enabled by the second pulsed signal and the output of the first NAND gate;

a first inverter configured to invert the output of the first NAND gate and provide the first output signal; and a second inverter configured to invert the output of the second NAND gate and provide the second output signal.

5. A method for detecting the phase difference between a first and a second input signal, the method comprising:

providing a first input signal to a first clocking terminal of a first D-type flip-flop;

providing a second input signal to a second clocking terminal of a second D-type flip-flop;

providing a high logic level signal to a first D input of the first D-type flip-flop and a second D input of the second-D-type flip flop;

generating, at a first output of the first D-type flip-flop, a first pulsed signal in response to a first defined occurrence of the first input signal;

generating, at a second output of the first D-type flip-flop, a second pulsed signal in response to a second defined occurrence of the second input signal;

generating, by a reset signal generator, a reset signal at a fixed delay from an occurrence of the first and second pulsed signals both being asserted;

providing the reset signal to a first reset terminal of the first D-type flip-flop and the second reset terminal of the second D-type flip flop; and generating first and second output signals based on the first and second pulsed signals respectively, wherein a time period when both first and second output signals are asserted is substantially reduced from a time period when both first and second pulsed signals are asserted.

6. The method of claim 5, wherein the first and second defined occurrences are the occurrence of a rising signal edge.

7. The method of claim 5, wherein the first and second defined occurrences are the occurrence of a falling signal edge.

* * * * *